US006737858B2

(12) United States Patent
Rearick et al.

(10) Patent No.: US 6,737,858 B2
(45) Date of Patent: May 18, 2004

(54) METHOD AND APPARATUS FOR TESTING CURRENT SINKING/SOURCING CAPABILITY OF A DRIVER CIRCUIT

(75) Inventors: Jeff Rearick, Ft Collins, CO (US); Hugh Wallace, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 91 days.

(21) Appl. No.: 10/099,618

(22) Filed: Mar. 14, 2002

(65) Prior Publication Data

US 2003/0173989 A1 Sep. 18, 2003

(51) Int. Cl.[7] ............................................. G01R 31/28
(52) U.S. Cl. ..................................... 324/158.1; 324/763
(58) Field of Search ................................. 324/763, 765, 324/158.1, 73.1, 500; 714/724–733; 438/14, 18

(56) References Cited

U.S. PATENT DOCUMENTS

| | | | |
|---|---|---|---|
| 5,847,561 A | * | 12/1998 | Whetsel .................... 324/158.1 |
| 6,008,664 A | | 12/1999 | Jett et al. |
| 6,107,814 A | * | 8/2000 | Martin ........................ 324/763 |
| 6,313,655 B1 | * | 11/2001 | Krause ........................ 324/763 |

* cited by examiner

Primary Examiner—Vinh P. Nguyen

(57) ABSTRACT

Method and apparatus of testing current sinking and sourcing capability of a driver in an IC calls for positioning a charge storage element at an output of the driver and charging it to a known voltage value. A pulse of known duration and voltage level is applied to an input of the driver and a resulting voltage value is measured at the output of the driver. A current flow through the driver is determined to be within testing limits by comparing an expected voltage value against the resulting voltage value.

An apparatus for testing current sinking and sourcing capacity of a driver in an IC has the driver with a charge storage element of known or measurable capacitive value at an output of the driver. An input circuit permits application of a test pulse of known duration and data input values to the driver. A receiver accepts an output of the driver for determining a threshold voltage value at the driver output.

17 Claims, 4 Drawing Sheets

METHOD AND APPARATUS FOR TESTING CURRENT SINKING/SOURCING CAPABILITY OF A DRIVER CIRCUIT

BACKGROUND

Integrated Circuit Devices ("ICs") are externally connected to IC packages through pads on the IC die. The pads comprise a mechanical contact site and associated circuitry to drive output signals and receive input signals. The technical specifications for the IC typically include minimum parameters of which the IC is capable of providing. One such parameter is the amount of current a driver circuit is able to source when it drives a high value and sink when it drives a low value. Test and measurement of the current capacity parameter typically involves use of an ammeter. An ammeter is often available as part of Automated Test Equipment ("ATE") that is conventionally used to test ICs. Use of the ammeter on the ATE requires direct connection between an ATE tester channel and the pad of the IC.

As ICs become larger and have more pads and associated circuitry to test, the commensurate ATE that has sufficient test channel capacity to connect a channel to each and every pad becomes quite expensive. A larger IC, therefore, requires a significantly larger capital outlay in order to test it using conventional techniques. An alternative to purchase of a larger ATE for testing larger ICs is selective test of some, but not all, of the pads. This alternative disadvantageously leaves certain IC specifications unverified and produces a costly risk of not identifying a faulty IC.

There is a need, therefore, to address the foregoing deficiencies of the prior art by testing a larger number of IC pads without requiring additional dedicated tester channels.

SUMMARY

A method of testing current sourcing or sinking capability of a driver in an IC calls for positioning a charge storage element at an output of the driver and forcing it to a known voltage value. A pulse of known duration and voltage level is applied to a tri-state control input of the driver and a resulting voltage value is measured at the output of the driver. A current flow through the driver is determined to be within testing limits by comparing an expected voltage value against the resulting voltage value.

According to another aspect of the present invention, an apparatus for testing current sourcing or sinking capability of a driver circuit in an IC has the driver circuit with a charge storage element of known capacitive value at an output of the driver circuit. An input circuit permits application of a test pulse of known duration and data input values to the driver circuit. A receiver accepts an output of the driver for determining a threshold voltage value at the driver output.

According to another aspect of a method for testing a driver output circuit according to the teachings of the present invention, an expected resulting voltage value of a charge storage element after application of a discharge pulse of known voltage and duration is calculated. A known charge is stored onto the charge storage element. The driver output circuit is placed in a tri-state condition and the discharge pulse is applied to the driver. A resulting voltage value of the charge storage element is determined to be greater than or less than the expected resulting voltage value.

According to these and other aspects of the present invention, an interface channel of an IC contains elements that make it possible to test current sourcing and current sinking capacity of the interface channel driver without use of a dedicated ATE channel. Advantageously, it is possible to more fully test aspects of an IC with a large number of driver circuits without requiring investment into ATE with a similarly large number of ATE channels.

DETAILED DESCRIPTION

Figure 1:
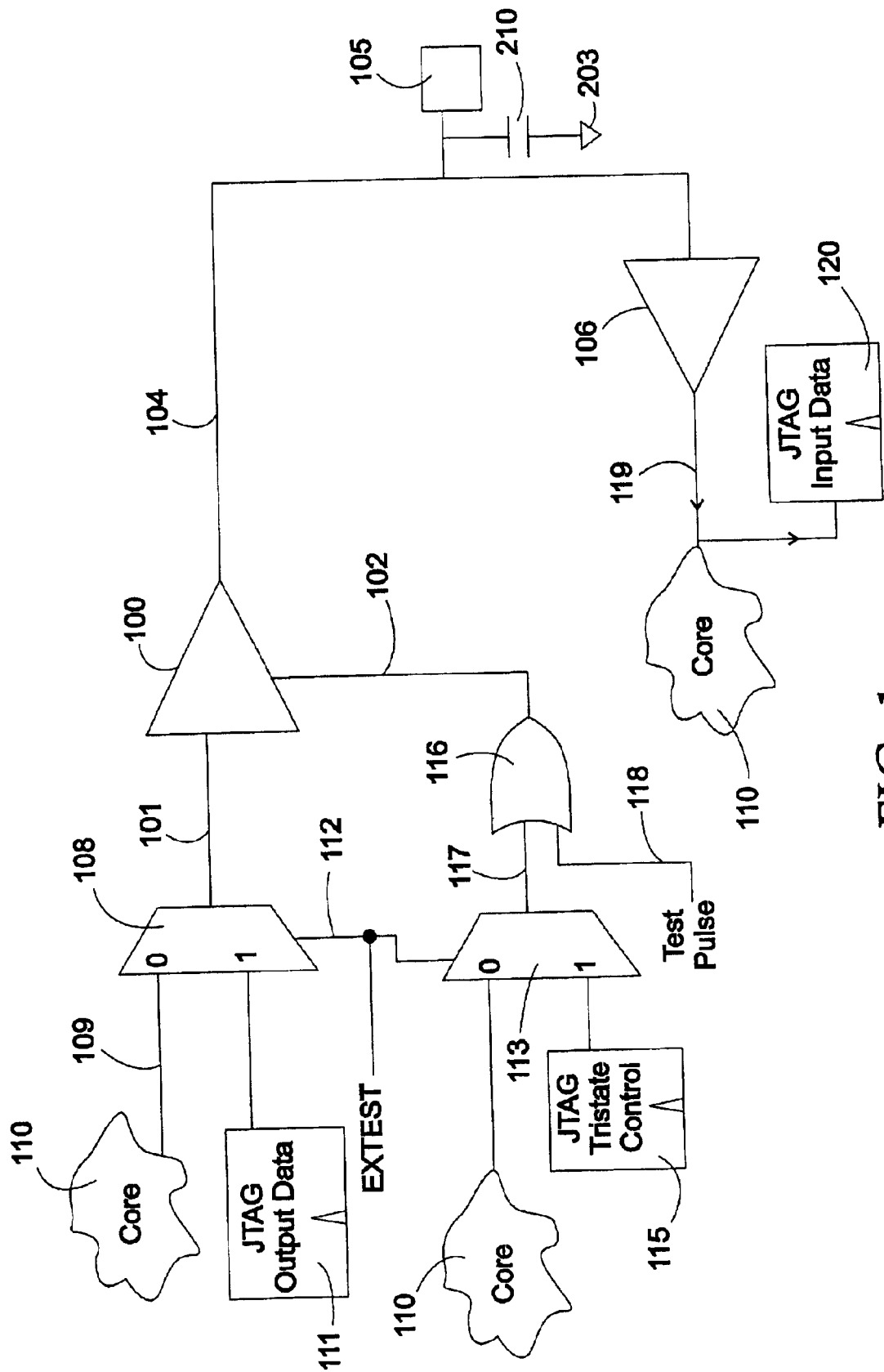
FIG. 1 is a circuit diagram of an embodiment of a bidirectional IC pad circuit according to the teachings of the present invention.

With specific reference to FIG. 1 of the drawings, there is shown a circuit diagram of an interface channel or pad circuit in an IC according to the teachings of the present invention in which a driver 100 accepts a data line 101 as an input and is controlled by a tri-state enable line 102. The output of the driver 104 is connected to a pad 105 that comprises a mechanical and electrical connection for the interface channel of the IC. The output of the driver 104 and the pad 105 is also electrically connected to an input of a receiver 106. The receiver 106 shown is an internally referenced comparator, but may also be an externally referenced comparator. The data line 101 is an output of 2×1 data multiplexor ("mux") 108. The two inputs to the data mux 108 comprise a core data line 109 coming from an IC core 110 and a JTAG output data register 111. Either one or the other of the two inputs to the data mux 108 is selected by an external test select signal ("EXTEST") 112. When the external test select signal ("EXTEST") 112 reflects a "1", the data line 101 is effectively detached from the IC core 110 and accepts data from the JTAG output data register 111. The tri-state enable line 102 is an output of 2-input OR gate 116 that accepts a tri-state control signal 117 and an ATE test pulse signal 118. The tri-state control signal 117 comprises the output of a tri-state mux 113. The tri-state mux 113 is also controlled by the external test select signal ("EXTEST") 112. When the external test select signal ("EXTEST") 112 reflects a "1", the tri-state enable line 102 is effectively detached from the IC core 110 and accepts a value from a JTAG tri-state control register 115. The test pulse signal 118 originates in either the ATE or in an on-chip pulse generation circuit controlled during test mode. As one of ordinary skill in the art appreciates, the reference to JTAG registers in the description is a reference to registers used in support of an IC that utilizes the teachings in IEEE-1149.1 Boundary Scan standard also referred to as the JTAG standard. In the JTAG standard, an IC has one or more internal registers that may be loaded with data as needed. Data for all of the registers are serially scanned over a number of clock cycles through five dedicated pins of the IC and into the internal JTAG registers available on the IC. This permits data to be loaded at locations internal to the IC for more direct test of the IC sub-circuits. The contents of these internal JTAG registers may also be scanned out of the IC. This permits data to be read from registers to test whether the IC internal sub-circuits are operating properly. Conventionally, JTAG registers are used to preload IC sub-circuits, the clock of the IC may be cycled a number of times, new data is captured in the JTAG registers, and the JTAG registers are then used to provide information as to the result of the IC sub-circuits after a certain number of cycles after the preloaded condition.

With further reference to FIG. 1 of the drawings, a receiver output 119 is connected to a JTAG receiver register 120 to record the results of a current test. The receiver output 119 is also connected to the IC core 110. An IC typically comprises a plurality of the pad circuits that are illustrated in FIG. 1 of the drawings. In such a case the JTAG tri-state control register 115 may be shared among a plurality of pad circuits. The illustrated embodiment according to the teachings of the present invention makes use of the JTAG registers and JTAG testing capability. Depending upon the IC circuitry, there may be reliable strategies to provide the appropriate data to the driver 100 and surrounding circuitry from the IC core 110. In this case, use of the JTAG standard would not be necessary to implement an embodiment according to the teachings of the present invention.

The test pulse 118 may be supplied to the IC in a number of ways. One of the simplest methods is a direct distribution within the IC from a test pulse pad (not shown) on the IC to one or more die pad circuits. Any number of conventional distribution plans is appropriate where the ATE test pulse 118 may be connected to the plurality of interface channels from a single test pulse IC pad. One of the ATE channels may be dedicated to the test pulse pad and is able to deliver a test pulse with sufficiently accurate timing to all drivers being tested.

Alternatively, the test pulse 118 may be delivered using a local fixed or programmable test pulse circuit. Such programmable pulse circuits are conventional in the art and are not shown in the present illustrations. In this case, the test pulse circuit may be a dedicated circuit for each pad circuit or may be shared among two or more interface channels.

Figure 2:
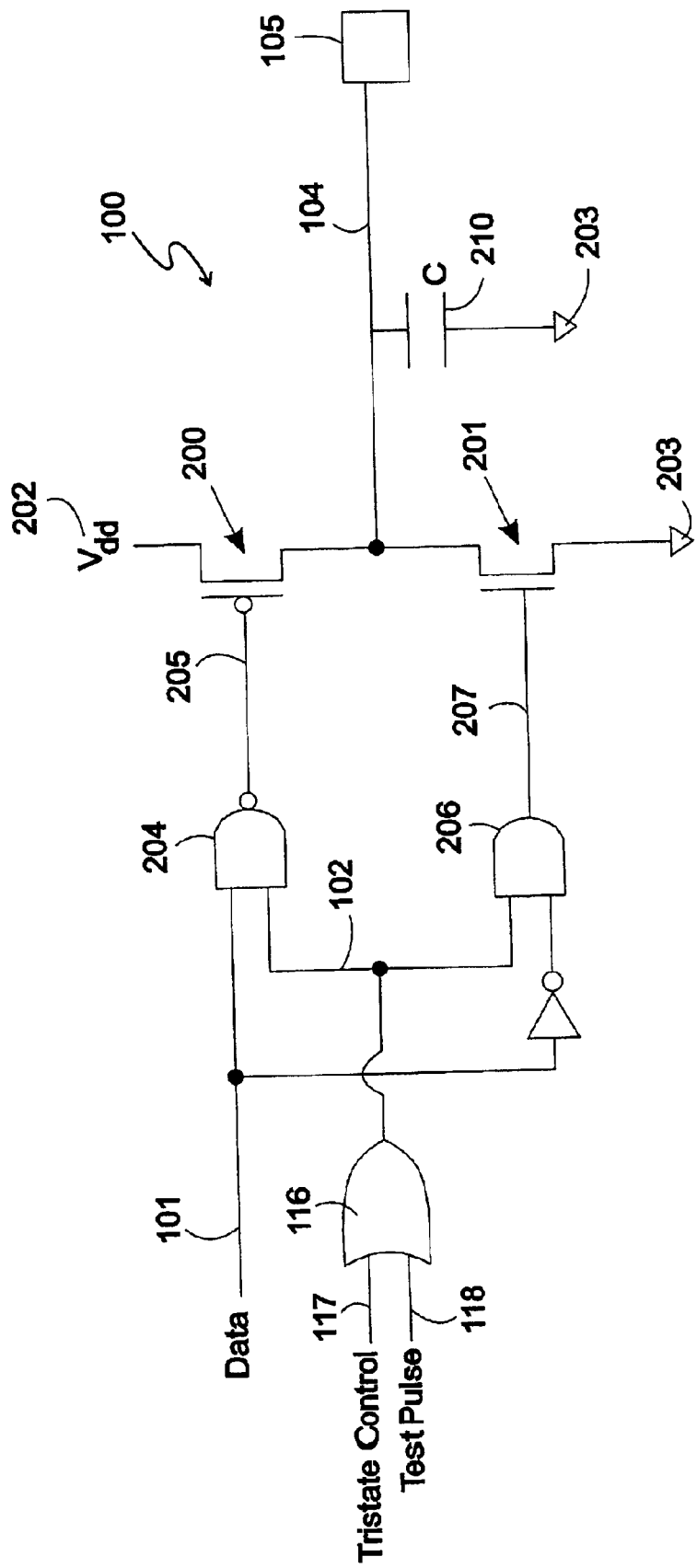
FIG. 2 is a more detailed circuit diagram of the driver shown in FIG. 1 of the drawings.

With specific reference to FIG. 2 of the drawings, there is shown a more detailed circuit diagram of the driver 100 shown in FIG. 1 of the drawings. The driver 100 comprises PFET 200 and NFET 201 tied in series between a bias potential 202 and reference potential 203 at the driver output 104. A charge storage element 210 is connected between the driver output 104 and reference potential 203. The charge storage element 210 may take the form of a capacitor or a FET structure with the drain and source terminals connected to the reference potential and the gate terminal connected to the driver output 104. Other structures with charge storage capacity may be used provided that the capacitive value of the structure is known or may be otherwise quantified. A charge storage element 210 created from a FET structure according to the teachings of the present invention has a capacitance of approximately 10 pF. An output of a dual input NAND gate 204 is connected to the gate terminal 205 of the PFT 200 and an output of a dual input AND gate 206 is connected to a gate terminal 207 of the NFET 201. An output of a dual input OR gate 208 is an input to both the dual input NAND gate 204 and the dual input AND gate 206. The data line 101 is a second input of the dual input NAND gate 204 and an inverse of the data line 101 is a second input of the dual input AND gate 206.

Figure 3:
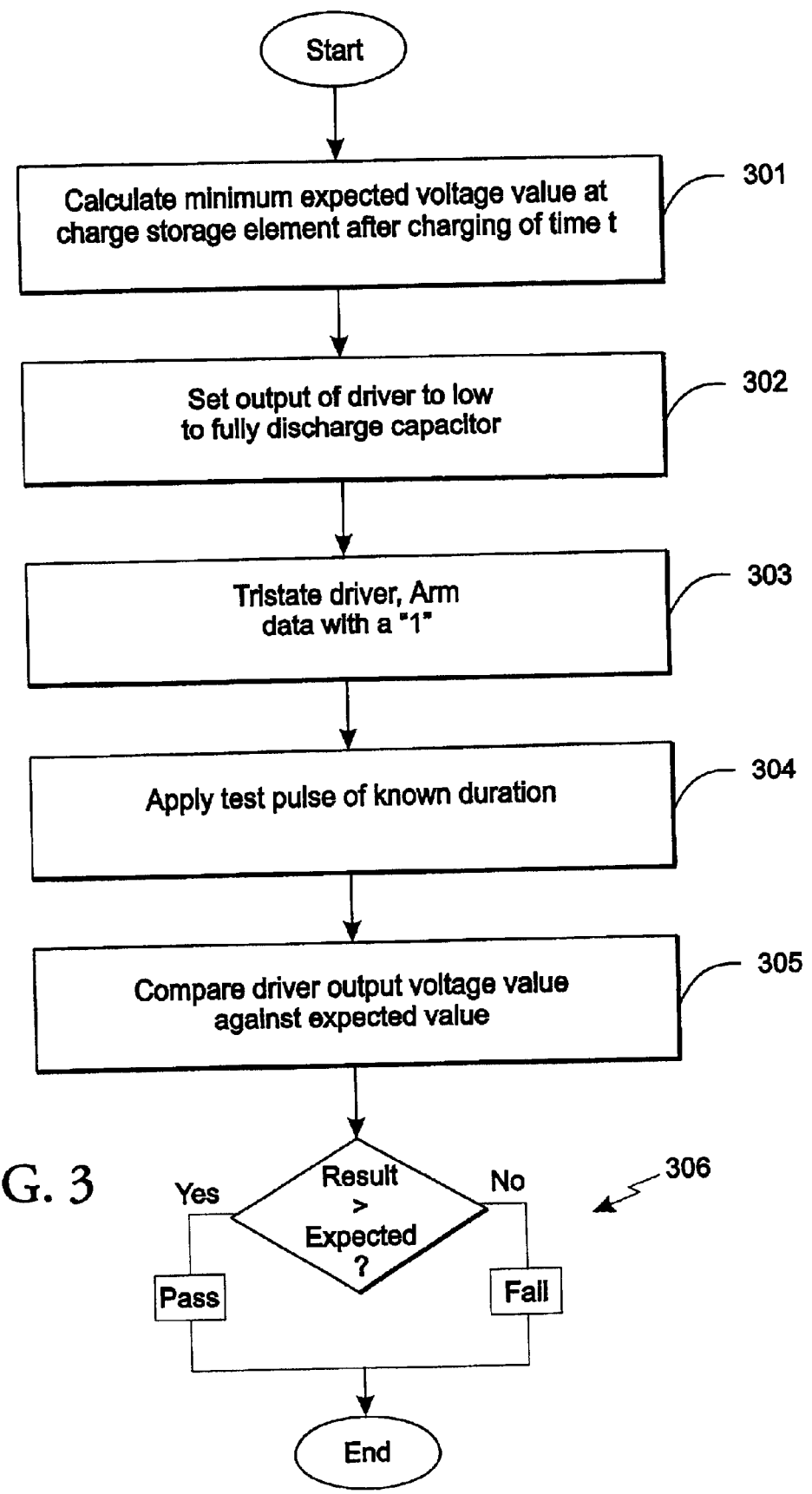
FIG. 3 is a flow diagram of an embodiment of a method according to the teachings of the present invention.

With specific reference to FIG. 3 of the drawings, there is shown a flow chart illustrating a method for testing a current source capability of the driver 100 the charge storage element 210 is fully discharged. The driver then drives a logic "1" or high value for some short duration as defined by a width of the test pulse 118 that is applied, 50 psec for example. The resulting voltage on the charge storage element 210 is measured and using the relationship:

$$i = \frac{CV}{t}$$

where C is the capacitive value of the charge storage element 210, V is the resulting voltage value after application of the test pulse 118, and t is the duration of the test pulse 118, one is able to calculate the current, i, that the driver was able to source during the test pulse.

With specific reference to FIG. 3 of the drawings, a first step, shown as 301, is to calculate a minimum expected voltage at the charge storage element 210 after application of the test pulse 118 assuming the charge storage element 210 is fully discharged upon application of the test pulse. Using the relationship:

$$V = \frac{it}{C}$$

where i is the minimum current sourcing capability specification for the IC under test, t is the duration of the test pulse 118, and C is the capacitive value of the charge storage element 210, one is able to calculate a minimum expected voltage at the charge storage element 210 after application of the test pulse 118 for a driver that passes the current source capability specification. A resulting voltage value above the expected voltage value indicates the tested driver 100 passes the current source capability test and a resulting voltage value below the expected voltage value indicates the tested driver 100 fails the current source capability test. See step 306. After calculating the expected voltage value at step 301, the ATE sets the external test signal ("EXTEST") 112 to a "1" indicating that the IC is set up internally for an external test. The output of the driver 100 is then set to a logic "0" to fully discharge the charge storage element 210 through NFET 201 at step 302. The charge storage element 210 is discharged by scanning a "0" into the JTAG data register 111 and a "1" into the JTAG tri-state control register 115. This causes the data line 101 to determine the logic level the driver 100 takes. In this case, the tri-state enable 102 is turned off and the test pulse signal 118 remains low. Accordingly, the data line 101 is loaded with a logic "0" which presents a logic "1" at the gate terminal of the PFET 200 and at the gate terminal of the NFET 201. This results in turning the NFET 201 "on" and the PFET 200 "off" permitting all charge stored in the charge storage element 210 to discharge through the NFET 201 in a low impedance state.

When the charge storage element 210 is fully discharged, the pad circuit is armed for the test pulse. The JTAG data register is armed with a "1", and the tri-state select register to a "0". In this state, the tri-state select register contents renders the OR gate 116 transparent to propagation of the test pulse. Accordingly, prior to propagation of the test pulse the PFET 200 and NFET 201 are both "off" and the driver is in its tri-state condition. See step 303. When the test pulse is propagated at step 304, the PFET 200 is turned on for the duration of the test pulse and the NFET 201 remains off during that time. After the test pulse is applied, there is a charge stored on the charge storage element 210 whose value is directly related to the amount of current the PFET 200 is able to source. The resulting voltage value held by the charge storage element 210, therefore, provides a reliable indication of the amount of the current the PFET 200 was able to source with the time period defined by the test pulse duration.

In one embodiment according to the teachings of the present invention, the minimum expected resulting voltage value is applied to the input of the receiver 106. If the charge stored on the charge storage element 210 is above the receiver's 106 internally referenced value, the receiver 106 registers a logic "1" at the receiver output 119. This logic "1" at the receiver output 119 is latched into the JTAG output register 120. After the test is completed, all of the JAG registers are scanned out of the IC and the logic value may be assessed by test software to determine that the charge stored equaled or exceeded the minimum expected resulting voltage value. See steps 305 and 306.

It may be important to more accurately quantify the resulting voltage value after application of the test pulse. In another embodiment, the receiver 106 may be an externally referenced receiver and the test software of the ATE may provide incrementally greater values at an external reference input of the alternative receiver (not shown). This process combined with successive detection at the JTAG output register 120 is able to determine between which two incremental values the resulting voltage value lies, thereby quantifying the actual value of the resulting voltage value. As one of ordinary skill in the art appreciates, the accuracy of the quantification under this embodiment depends upon the size of the voltage increments applied to the external reference input of the receiver.

In yet another embodiment where a plurality of drivers is tested in this manner, one in the plurality of drivers may be assigned an ATE channel. The ATE channel can measure the actual current sourced by the PFET 200 with an ammeter of the ATE channel and then measure the resulting voltage value with a voltmeter of the ATE channel. In so doing, the test software can calculate the capacitance of the charge storage element 210 using the relationship:

$$C = \frac{it}{V}$$

where i is the measured current, t is the test pulse duration, and V is the measured resulting voltage value. It is reasonable to assume that all charge storage elements 210 in the plurality of drivers 100 have approximately the same value because they were created using the same structure manufactured using the same process. Accepting this assumption permits a test designer to measure the capacitance of the charge storage element 210 with reasonable accuracy. Of course, the empirical accuracy of the measurement depends upon the accuracy and calibration of the ATE ammeter and voltmeter. Given an accurate capacitance value for C and an accurate time duration of the test pulse 118, t, the minimum expected voltage value is calculated reasonably accurately. This reasonably accurate minimum expected voltage value may then be used as a basis for testing those drivers without ATE channels assigned to them.

The test for a current sink capability of the driver 100 is similar to the test for the current source capability described above. In the current sink capability test, the charge storage element 210 is first fully charged. The driver output 104 then drives a logic "0" or low value for some short duration as defined by the duration of the test pulse 118 applied. The resulting voltage on the charge storage element 210 is then measured. Using the relationship:

$$i = \frac{CV}{t}$$

where C is the capacitive value of the charge storage element 210, V is the resulting voltage value after application of the test pulse 118, and t is the duration of the test pulse 118, one is able to determine the current, i, that the driver was able to sink during the test pulse.

Figure 4:
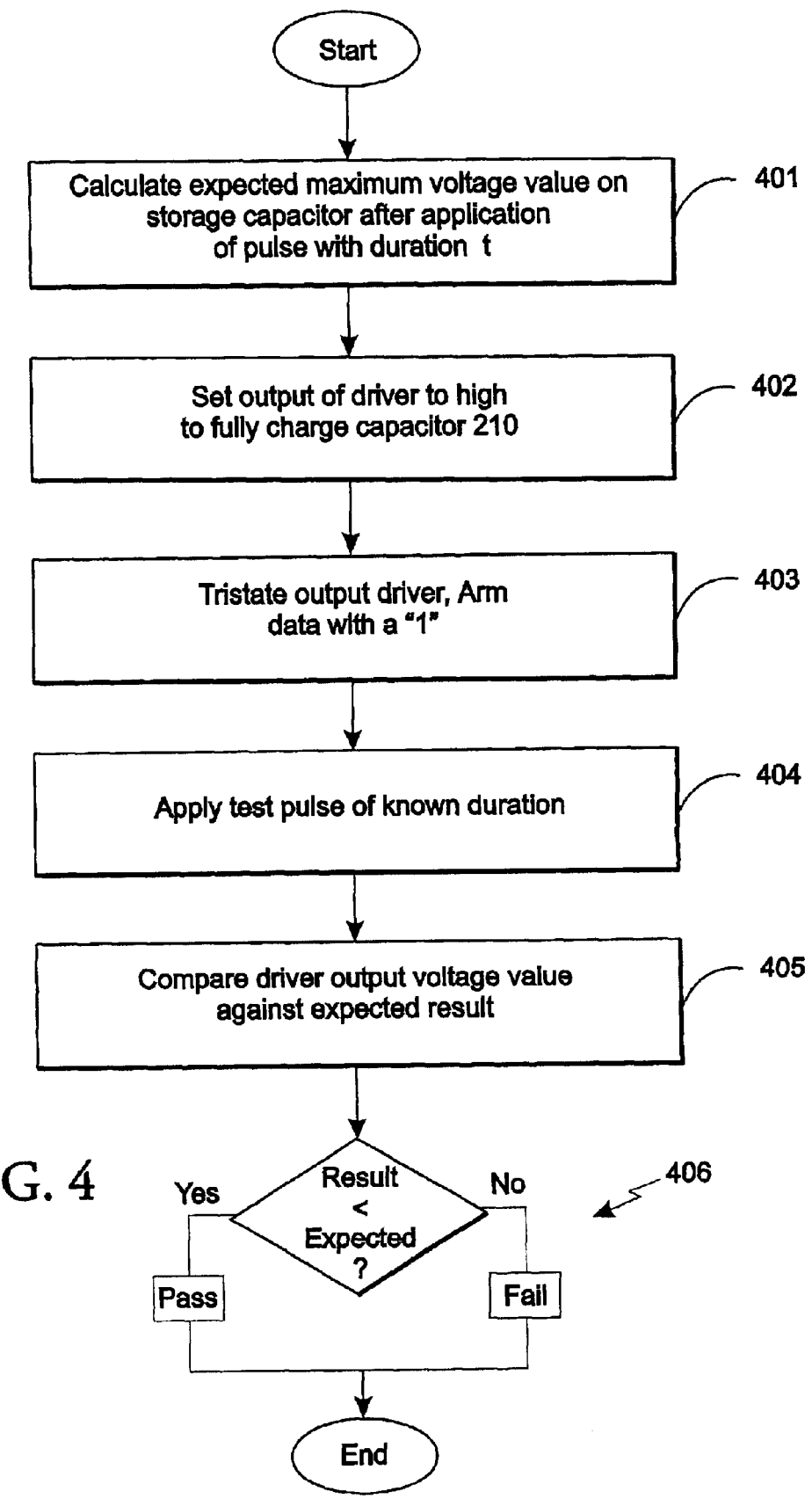
FIG. 4 is a flow diagram of another embodiment of a method according to the teachings of the present invention.

With specific reference to FIG. 4 of the drawings, there is shown a flow chart for a current sink capability test according to the teachings of the present invention in which a first step is to calculate a maximum expected voltage at the charge storage element 210 after application of the test pulse 118. Using the relationship:

$$V = \frac{it}{C}$$

where i is the minimum current sinking capability specification for the IC under test, t is the duration of the test pulse 118, and C is the capacitive value of the charge storage element 210, one is able to calculate a maximum expected voltage at the charge storage element 210 after application of the test pulse 118 for a driver that passes the current sink capability test. A resulting voltage value below the expected voltage value indicates the tested driver 100 passes the current sink capability test and a resulting voltage value above the expected voltage value indicates the tested driver 100 fails the current sink capability test. After calculating the expected voltage value at step 401, the output of the driver 100 is set to a logic "1" to fully charge the charge storage element 210 through PFET 200 at step 402. The charge storage element 210 is charged by scanning a "1" into the JTAG data register 111 and a "1" into the JTAG tri-state control register 115. This causes the data line 101 to determine the logic level the driver 100 takes. In this case, the tri-state enable 102 is a logic "1" and the driver 100 is not in a tri-state mode. Accordingly, the data line 101 is loaded with a logic "1" which presents a logic "0" at the gate terminal of the PFET 200 and at the gate terminal of the NFET 201. This results in turning the PFET 200 "on" and the NFET 201 "off" permitting the bias potential to charge the charge storage element 210 through the PFET 200 in a low impedance state. When the charge storage element 210 is fully charged, the JTAG registers are reloaded. The external test signal remains a "1", the JTAG data register is loaded with a "0", and the tri-state select register is loaded with a "0". In this state, the OR gate 116 permits unhindered propagation of the test pulse 118. Prior to propagation of the test pulse 118, however, because the test pulse 118 remains low until the pulse applied, the PFET 200 and NFET 201 are both "off" and the driver is in its tri-state condition at step 403. When the test pulse 118 is propagated at step 404, the NFET 201 is turned on for the duration of the test pulse and the PFET 200 remains off during that time. See step 404. After the test pulse is applied, there is a charge stored on the charge storage element 210 whose value is directly related to the amount of current the NFET 201 is able to sink.

The test for whether the driver 100 is able to sink enough current is similar to the test for current source capability except that the test looks for a resulting voltage value held by the charge storage element 210 that is below the maximum expected resulting voltage value. Accordingly, the maximum expected resulting voltage value is applied to the input of the receiver 106 as part of step 405. If the charge stored at the driver output 104 is below the receiver's internally referenced threshold value, the receiver 106 registers a logic "0" at the receiver output 119. This logic "0" at the receiver output 119 is latched into the JTAG output register 120. After the test is completed, all of the JAG registers are scanned out of the IC and the logic value is assessed by test software to determine that the charge stored is below the maximum expected resulting voltage value. See step 406.

In the embodiment that uses an ATE channel to measure current and voltage of one channel, thereby calculating the charge storage element's 210 capacitive value, if the capacitance of the charge storage element 210 was already measured as part of the current source capability test, it is not necessary to measure it again during the current sink capability test. If the current sink capability test is performed first, however, it is possible to make the same measurement using a dedicated ATE channel during a current sink capability test. The calculated capacitance value, however, applies to both tests.

If it is desired to more accurately quantify the resulting voltage value after application of the test pulse, the test software of the ATE may provide incrementally lesser values athreshold voltage input of an externally referenced receiver 106 combined with detection at the JTAG output register 120. In this embodiment, the ATE software is able to determine between which two incremental values the resulting voltage value lies, thereby quantifying the actual value of the resulting voltage value. As one of ordinary skill in the art appreciates, the accuracy of the quantification under this embodiment depends upon the size of the voltage increments applied to the threshold voltage input of the externally referenced receiver.

Teachings of the present invention are described herein by way of example. The disclosure and drawings are to be considered illustrative, limitations being described only by reference to the appended claims. Alternatives will occur to those of ordinary skill in the art with benefit of the present teachings. Alternatives include, but are not limited to, driver and supporting circuitry that make up the pad circuit that is comprised of differing discreet elements, but still perform substantially the same function. An externally connected capacitor may be used instead of the charge storage element 210 that is made part of the pad circuit. The externally connected capacitor may be disposed on either the IC die as suggested and shown in the present disclosure, on an IC package of the IC being tested, or on a printed circuit board to which a packaged IC is connected. Alternatives to the PFETs and NFETs as components of the driver are also within the capabilities of one of ordinary skill in the art. In addition, more elaborate test software may be used that include both the current sinking and sourcing capability test and well as others.

What is claimed is:

1. A method of testing current sinking and sourcing capability of a driver in an IC comprising the steps of:
    positioning a charge storage element of known capacitive value at an output of said driver,
    charging said charge storage element to a known voltage value,
    applying a pulse of known duration and voltage level to a tri-state control input of said driver,
    measuring a resulting voltage value at said output of said driver, and
    determining whether a current flow during said application of said pulse is within testing limits by comparing an expected voltage value against said resulting voltage value.

2. A method of testing as recited in claim 1 wherein said step of measuring comprises the step of comparing said resulting voltage value against a threshold voltage value.

3. A method of testing as recited in claim 2 and further comprising the step of calculating said threshold voltage value based upon a capacitive value of said charge storage element, said known voltage value, said pulse duration, and said pulse voltage level.

4. A method of testing as recited in claim 2 and further comprising repeating said step of comparing said resulting voltage value against a plurality of threshold voltage values.

5. A method of testing as recited in claim 1 wherein said step of applying said pulse comprises the step of supplying said pulse from a channel of an ATE to a plurality of said drivers.

6. A method of testing as recited in claim 1 wherein said step of applying said pulse comprises generating said pulse in a programmable pulse generator circuit.

7. A method of testing as recited in claim 1 and further comprising the step of scanning values into scannable registers to establish testing parameters.

8. A method of testing as recited in claim 7 wherein said scannable registers control an output driver voltage value and a driver tri-state select.

9. An apparatus for testing current sinking and sourcing capability of a driver circuit in an IC comprising:
    the driver circuit,
    a charge storage element of known capacitive value at an output of said driver circuit,
    an input circuit permitting application of a test pulse of known duration and data input values to said driver circuit, and
    a receiver accepting an output of said driver for determining a threshold voltage value at said driver output.

10. An apparatus as recited in claim 9 wherein said driver circuit comprises a PFET in series with an NFET and said charge storage element is electrically disposed between an interconnection of said PFET and said NFET and a reference potential.

11. An apparatus as recited in claim 9 wherein said charge storage element comprises a FET with drain and source terminals electrically connected.

12. An apparatus as recited in claim 9 and further comprising a means for scanning values into said input circuit to control said application of said test pulse of known duration and data input values.

13. A method for testing a driver comprising the steps of:
    calculating an expected resulting voltage value of a charge storage element after application of a pulse of known voltage and duration through said driver,
    storing a known charge on said charge storage element,
    tri-stating said driver,
    applying said pulse, and
    determining whether a resulting voltage value of said charge storage element is greater than or less than said expected resulting voltage value.

14. A method for testing a driver output circuit as recited in claim 13 wherein said step of calculating said expected resulting voltage value makes use of the equation $$\frac{it}{C}$$

where i is an expected current flow, t is a duration of said pulse, and C is the capacitive value of said charge storage element.

15. A method for testing a driver output circuit as recited in claim 13 wherein said step of determining comprises the steps of iteratively comparing said resulting voltage value against different known threshold voltage values until it is determined that said resulting voltage value is between two of the threshold voltage values.

16. A method for testing a driver output circuit as recited in claim 13 wherein said step of determining comprises measuring whether said resulting voltage value is above a known threshold voltage value.

17. A method for testing a driver output circuit as recited in claim 13 wherein said step of determining comprises measuring whether said resulting voltage value is below a known threshold voltage value.

* * * * *